(12) United States Patent
Hu

(10) Patent No.: US 11,049,779 B2
(45) Date of Patent: Jun. 29, 2021

(54) CARRIER FOR CHIP PACKAGING AND MANUFACTURING METHOD THEREOF

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 16/558,180

(22) Filed: Sep. 2, 2019

(65) Prior Publication Data

US 2020/0118898 A1 Apr. 16, 2020

Related U.S. Application Data

(60) Provisional application No. 62/744,663, filed on Oct. 12, 2018.

(51) Int. Cl.
*H01L 23/48* (2006.01)
*H01L 23/52* (2006.01)
(Continued)

(52) U.S. Cl.
CPC ............ *H01L 23/13* (2013.01); *H01L 21/566* (2013.01); *H01L 23/481* (2013.01);
(Continued)

(58) Field of Classification Search
CPC ... H01L 23/13; H01L 23/481; H01L 23/5226; H01L 23/5283; H01L 21/566; H01L 24/09; H01L 24/17; H01L 2224/0231; H01L 2224/02373; H01L 2224/02381; H01L 2224/0401; H01L 23/498–49894; H01L 23/538–5389; H01L 23/49822; H01L 23/5383; H01L 23/49833; H01L 23/5385; H01L 23/4985; H01L 23/5387; H01L 23/14; H01L 23/5386
(Continued)

(56) References Cited

U.S. PATENT DOCUMENTS

2013/0032390 A1* 2/2013 Hu .................... H01L 23/13
174/266
2017/0084548 A1* 3/2017 Hu .................... H01L 21/4853
(Continued)

FOREIGN PATENT DOCUMENTS

| CN | 105374693 | 3/2016 |
| KR | 20160029621 | 3/2016 |
| TW | 201413872 | 4/2014 |

OTHER PUBLICATIONS

"Office Action of Taiwan Counterpart Application", dated May 29, 2020, p. 1-p. 3.

*Primary Examiner* — Calvin Y Choi
(74) *Attorney, Agent, or Firm* — JCIPRNET

(57) ABSTRACT

A carrier for a semiconductor chip mounting thereon and a manufacturing method thereof are provided. The carrier includes a fine redistribution structure, a plurality of conductive connectors, and an insulating layer. The fine redistribution structure has a first surface and a second surface opposite to each other, where the semiconductor chip is mounted on the first surface of the fine redistribution structure. The conductive connectors are disposed on the second surface of the fine redistribution structure and electrically coupled to the semiconductor chip through the fine redistribution structure. The insulating layer is disposed on the second surface of the fine redistribution structure to laterally cover the conductive connectors.

7 Claims, 13 Drawing Sheets

(51) Int. Cl.
*H01L 29/40* (2006.01)
*H01L 23/13* (2006.01)
*H01L 23/00* (2006.01)
*H01L 21/56* (2006.01)
*H01L 23/528* (2006.01)
*H01L 23/522* (2006.01)

(52) U.S. Cl.
CPC ...... *H01L 23/5226* (2013.01); *H01L 23/5283* (2013.01); *H01L 24/09* (2013.01); *H01L 24/17* (2013.01); *H01L 2224/0231* (2013.01); *H01L 2224/02373* (2013.01); *H01L 2224/02381* (2013.01); *H01L 2224/0401* (2013.01)

(58) Field of Classification Search
USPC .......................................................... 257/773
See application file for complete search history.

(56) References Cited

U.S. PATENT DOCUMENTS

| | | | |
|---|---|---|---|
| 2017/0154858 A1 | 6/2017 | Tsai et al. | |
| 2017/0229409 A1* | 8/2017 | Hu | ..................... H01L 25/0655 |
| 2018/0130745 A1* | 5/2018 | Hu | ......................... H01L 24/03 |

* cited by examiner

CARRIER FOR CHIP PACKAGING AND MANUFACTURING METHOD THEREOF

CROSS REFERENCE TO RELATED APPLICATION

This application claims the priority benefit of U.S. provisional application Ser. No. 62/744,663, filed on Oct. 12, 2018. The entirety of the above-mentioned patent application is hereby incorporated by reference herein and made a part of specification.

BACKGROUND OF THE INVENTION

1. Field of the Invention

The present invention relates to a carrier and manufacturing method thereof, and more specifically relates to a carrier for a semiconductor chip mounting thereon and a manufacturing method of the carrier.

2. Description of Related Art

As the electronic industry has rapidly developed, the trend in electronic products has been to gradually move toward faster, reliable, smaller with multi-functionality and high performance. One of the conventional electronic structures has a chip package mounted on a carrier substrate including an interposer and/or a packaging substrate. Such electronic structure may be undesirably thick due to the combined height of the chip package and the carrier substrate. This is due to the use in conventional packaging techniques of relatively costly interposers including a silicon substrate and a through silicon vias (TSVs) extending through the silicon substrate. Moreover, currently used packaging substrates, such as a printed circuit board (PCB), are difficult to minimize the entire size and the dimension of through core via therein. In order to meet the demand for miniaturization requirement of electronic products, fabricating a carrier for chip packaging to be lighter, thinner, shorter and smaller, while keeping the manufacturing process simple has become a challenge to researchers in the field.

SUMMARY OF THE INVENTION

The invention provides a carrier for a chip package mounting thereon and a manufacturing method of the carrier, which is helpful to miniaturization design and keeps the manufacturing process simple.

The invention provides a carrier for a semiconductor chip mounting thereon. The carrier includes a fine redistribution structure, a plurality of conductive connectors, and an insulating layer. The fine redistribution structure has a first surface and a second surface opposite to each other, where the semiconductor chip is mounted on the first surface of the fine redistribution structure. The conductive connectors are disposed on the second surface of the fine redistribution structure and electrically coupled to the semiconductor chip through the fine redistribution structure. The insulating layer is disposed on the second surface of the fine redistribution structure to laterally cover the conductive connectors.

In some embodiments, the insulating layer is made of an underfill material or a molding compound. In some embodiments, the carrier further includes a top redistribution structure connected to the conductive connectors, and a bottom redistribution structure connected to the top redistribution structure and disposed opposite to the conductive connectors, where conductive elements of the top redistribution structure and the bottom redistribution structure are coarser than conductive elements of the fine redistribution structure, and a contact density of the top redistribution structure is denser than a contact density of the bottom redistribution structure. In some embodiments, the carrier further includes a core layer and a plurality of through core vias passing through the core layer and electrically connected to the top redistribution structure and the bottom redistribution structure, where the core layer has a top surface and a bottom surface opposing to each other, and the top redistribution structure is disposed on the top surface and the bottom redistribution structure is disposed on the bottom surface. In some embodiments, a dimension of each of the conductive connectors is less than a dimension of each of the through core vias. In some embodiments, the insulating layer partially covers the conductive connectors, and each of the conductive connectors has a section protruding from the insulating layer and connected to the top redistribution structure. In some embodiments, each of the conductive connectors has a bump connected to the fine redistribution structure, and a solder cap disposed on the bump and connected to the top redistribution structure. In some embodiments, the carrier further includes a surface finishing layer disposed on the fine redistribution structure opposite to the conductive connectors, where the semiconductor chip is mounted on the fine redistribution structure through the surface finishing layer. In some embodiments, a height of one of the conductive connectors ranges from 20 μm to 200 μm.

The invention provides another carrier for a semiconductor chip mounting thereon. The carrier includes an interposer, a top redistribution structure, and a bottom redistribution structure disposed on the top redistribution structure opposite to the interposer. The interposer includes a substrate and a plurality of through substrate vias passing through the substrate, where the semiconductor chip is mounted on the interposer and electrically connected to the through substrate vias. The top redistribution structure is disposed on the interposer opposite to the semiconductor chip and electrically connected to the through substrate vias. The bottom redistribution structure is electrically connected to the top redistribution structure, where a contact density of the top redistribution structure is denser than a contact density of the bottom redistribution structure.

In some embodiments, the carrier further includes a core layer and a plurality of through core vias passing through the core layer and electrically connected to the top redistribution structure and the bottom redistribution structure, where the core layer has a top surface and a bottom surface opposing to each other, and the top redistribution structure is disposed on the top surface and the bottom redistribution structure is disposed on the bottom surface. In some embodiments, an interface between the interposer and the top redistribution structure is free of solder material. In some embodiments, the top redistribution structure is directly connected to the bottom redistribution structure, and the top redistribution structure is bonded to the interposer through a plurality of solder balls.

The invention provides a manufacturing method of a carrier for a semiconductor chip mounting thereon. The method includes at least the following steps. A plurality of conductive connectors is formed on a fine redistribution structure to form a first portion, where the semiconductor chip is adapted to be mounted on the fine redistribution structure opposite to the conductive connectors. The first portion is disposed on a second portion, where the second portion includes a top redistribution structure and a second redistribution structure connected to the top redistribution structure, the first portion is disposed on the top redistribution structure, and a contact density of the top redistribution structure is denser than a contact density of the bottom redistribution structure.

In some embodiments, each of the conductive connectors includes a bump and a solder cap formed on the bump, forming the first portion includes disposing the conductive connectors over a temporary carrier through a release layer after forming the conductive connectors on the fine redistribution structure, where the release layer is disposed between the fine redistribution structure and temporary carrier to bury the conductive connectors therein. In some embodiments, a surface finishing layer is formed on the fine redistribution structure opposite to the conductive connectors after disposing the conductive connectors over the temporary carrier, and the semiconductor chip is adapted to be mounted on the fine redistribution structure through the surface finishing layer. In some embodiments, an underfill material is formed on the second portion to cover the conductive connectors after disposing the first portion on the second portion. In some embodiments, each of the conductive connectors includes a bump and a solder cap formed on the bump, and forming the first portion includes the following steps. The bumps of the conductive connectors are formed on the fine redistribution structure. An insulating layer is formed on the fine redistribution structure to partially cover the bumps of the conductive connectors, where each of the bumps of the conductive connectors includes a section protruding from the insulating layer. Each of the solder caps is formed on one of the sections of the bumps to form the conductive connectors. In some embodiments, the insulting layer is formed by a molding process. In some embodiments, disposing the first portion on the second portion includes bonding the solder caps of the conductive connectors to the top redistribution structure of the second portion.

Based on the above, the first portion of the circuit carrier for semiconductor chips mounted thereon includes the conductive connectors, and the underfill layer or the insulating layer laterally covering the conductive connectors for protection. In such configuration, the conventional silicon substrate is omitted, thereby reducing the manufacturing cost and keeping the manufacturing process simple. The second portion of the circuit carrier connected to the first portion may include the core layer and the through core vias passing through the core layer. In other embodiments, the core layer and the through core vias are omitted, thereby reducing the overall thickness and keeping the conductivity path short. The first portion and the second portion may be bonded to each other without disposed solder balls therebetween while keeping the reliability of the circuit carrier.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
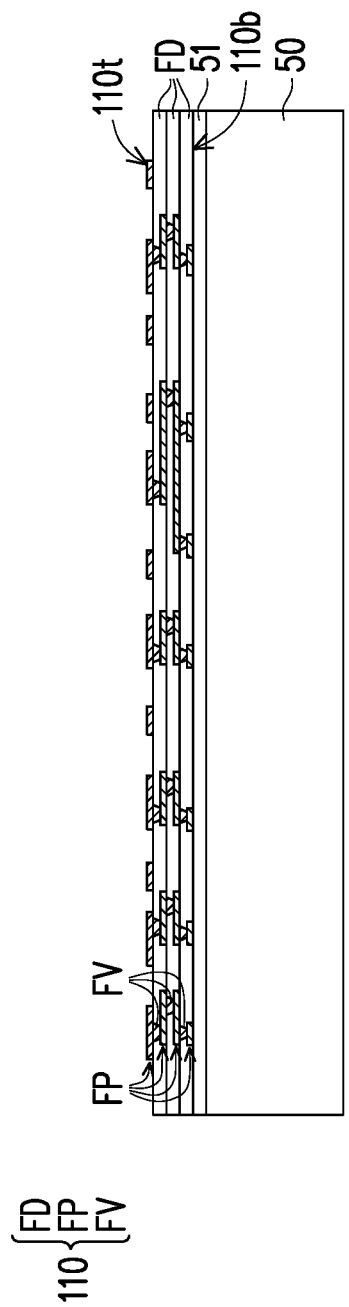
FIG. 1 to FIG. 6 are schematic cross-sectional views illustrating a manufacturing method of a circuit carrier with a chip mounted thereon according to some embodiments of the invention.

Reference will now be made in detail to the present preferred embodiments of the invention, examples of which are illustrated in the accompanying drawings. Wherever possible, the same reference numbers are used in the drawings and the description to refer to the same or like parts. The elements illustrating as dashed lines throughout the drawings indicate that these elements may be or may not be present.

Figure 3:
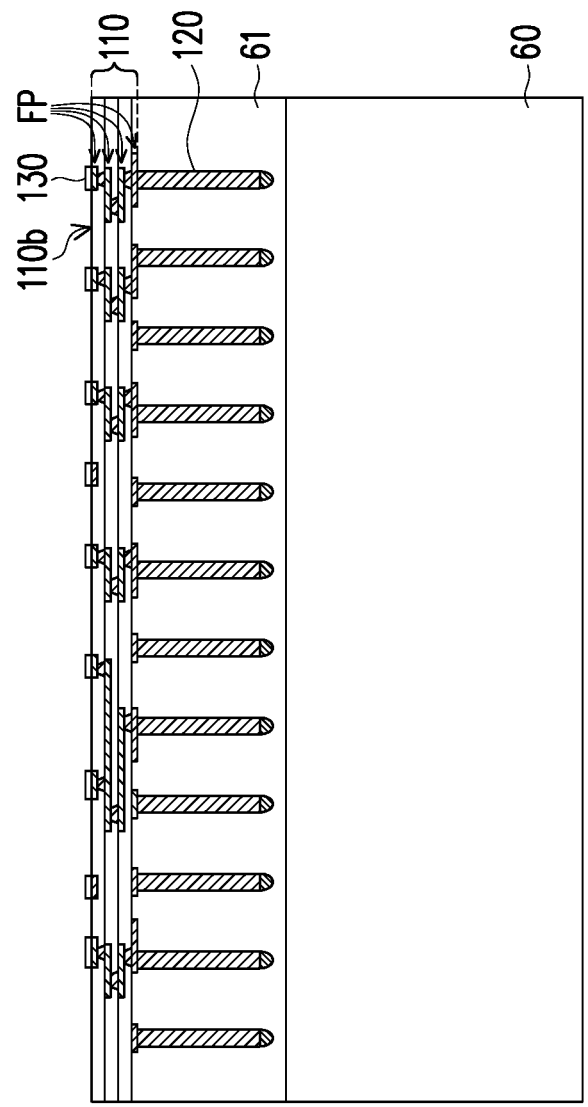
Figure 4:
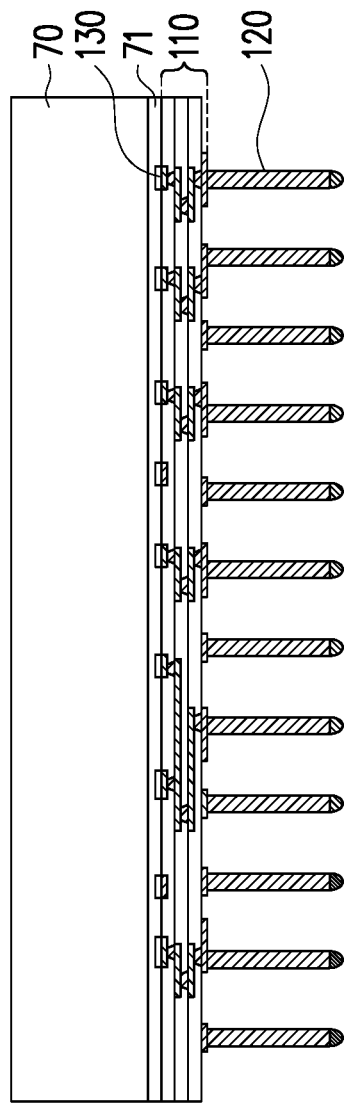
Figure 5:
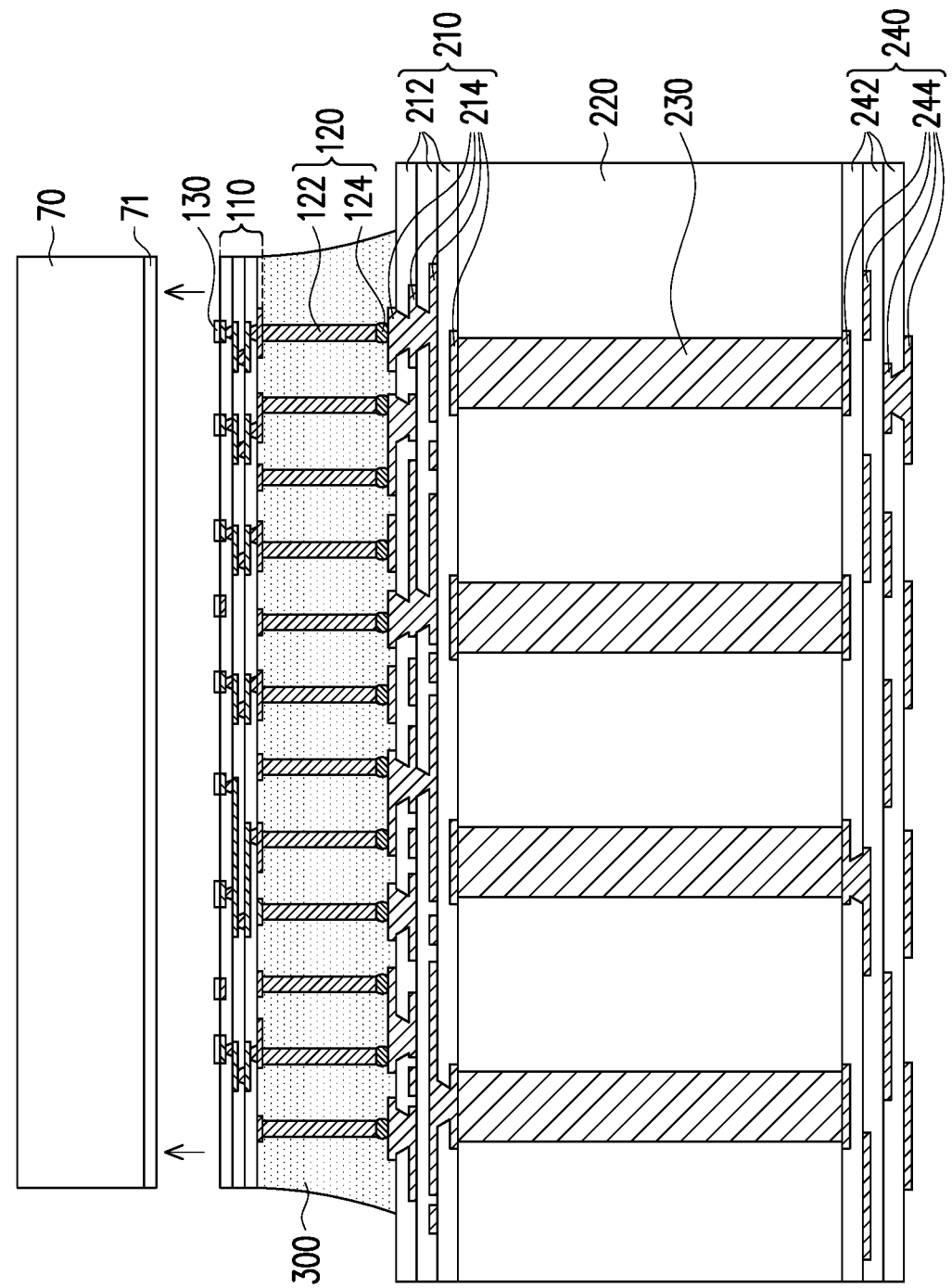

FIG. 1 to FIG. 6 are schematic cross-sectional views illustrating a manufacturing method of a circuit carrier with a chip mounted thereon according to some embodiments of the invention. The circuit carrier may include a first portion and a second portion connected to the first portion. For example, FIG. 1 through FIG. 4 illustrates a manufacturing method of the first portion of the circuit carrier. The second portion of the circuit carrier as shown in FIG. 5 may be pre-formed or may be fabricated separately from the first portion of the circuit carrier.

Referring to FIG. 1, a fine redistribution structure 110 is formed over a first temporary carrier 50. The first temporary carrier 50 may be made of glass, plastic, silicon, metal, or other suitable materials as long as the material is able to withstand the subsequent processes while carrying a structure formed thereon. In some embodiments, a first release layer 51 (e.g., a light to heat conversion film, or other suitable de-bonding layer) is applied on the first temporary carrier 50, and the fine redistribution structure 110 may be formed on the first release layer 51 to enhance the releasibility of the fine redistribution structure 110 from the first temporary carrier 50 in a subsequent process.

In some embodiments, the fine redistribution structure 110 including a fine conductive pattern FP, a fine dielectric layer FD, and a fine conductive via FV is formed over the first temporary carrier 50. Materials of the fine dielectric layer FD includes polyimide (PI), benzocyclobutene (BCB), polybenzoxazole (PBO), inorganic dielectric material (e.g., silicon oxide, silicon nitride, or the like), or other suitable insulating materials. Materials of the fine conductive pattern FP and the fine conductive via FV includes copper, gold, nickel, aluminium, platinum, tin, combinations thereof, an alloy thereof, or another suitable conductive material.

For example, the fine conductive pattern FP may be formed over the first temporary carrier 50 using a deposition process (e.g., plating, sputtering, chemical vapour deposition), a lithography process and an etching process, or other suitable processes. The fine conductive pattern FP may be a patterned conductive layer with fine line/space routing. Next, the fine dielectric layer FD including openings may be formed over the first temporary carrier 50 to cover the fine conductive pattern FP using, for example, a coating process, lithography and an etching process, or other suitable processes. The openings of the fine dielectric layer FD may expose at least the portion of the fine conductive pattern FP for electrical connection. In other embodiments, the fine dielectric layer FD is formed before the fine conductive pattern FP.

Next, a conductive material may be formed inside the openings of the fine dielectric layer FD to form the fine conductive vias FV using suitable deposition process. The conductive material may also be formed on the top surface of fine dielectric layer FD, and then patterned to form another level of the fine conductive pattern FP. The above-mentioned steps may be performed multiple times such that the fine conductive patterns FP and the fine dielectric layers FD are alternately stacked and the fine conductive vias FV are embedded in the fine dielectric layers FD. The fine conductive vias FV may be formed to be electrically and physically connected between the fine conductive patterns FP in different layers. In some embodiments, the fine redistribution structure 110 is a stack of layers having fine line/space routing and may be fabricated according to integrated circuit design rules. It should be noted that the first redistribution structure shown in FIG. 1 is merely exemplary, more levels or less levels of the first redistribution structure may be formed as required by the circuit design.

The fine redistribution structure 110 includes a top surface 110t and a bottom surface 110b opposite to each other, where the bottom surface 110b faces toward the first temporary carrier 50. The fine conductive pattern FP and the fine dielectric layer FD at the bottom surface 110b of the fine redistribution structure 110 may be substantially leveled. The fine conductive vias FV may be tapered toward the first temporary carrier 50. For example, the fine conductive vias FV includes slanted sidewalls, and a width (or diameter) of each fine conductive via FV gradually increases in a direction from the bottom surface 110b to the top surface 110t. Alternatively, the fine conductive vias FV include vertical sidewalls with respective to the bottom surface 110b. In some embodiments, the fine conductive pattern FP at the bottom surface 110b of the fine redistribution structure 110 includes a plurality of chip bonding pads for the subsequently mounted semiconductor chip(s).

Figure 2:
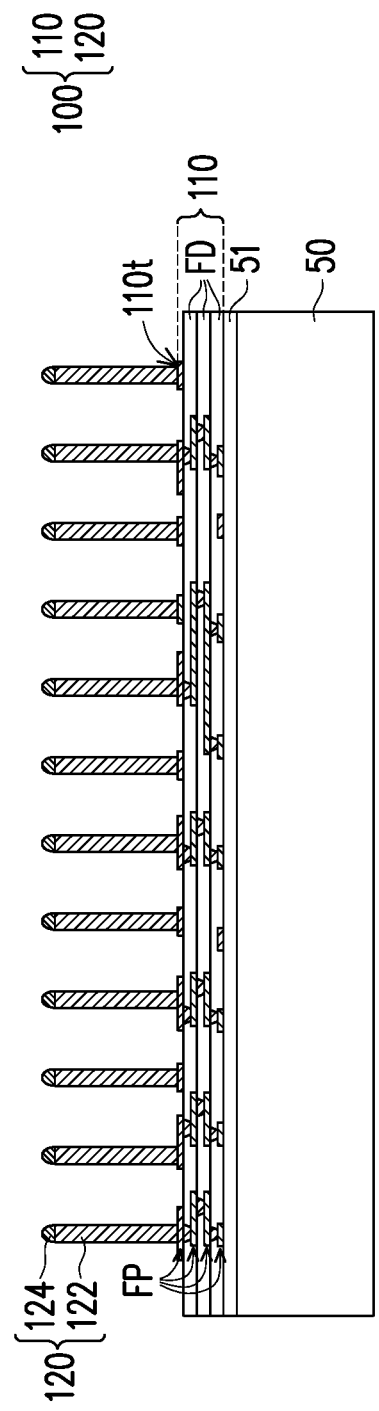

Referring to FIG. 2, a plurality of conductive connectors 120 is formed on the fine redistribution structure 110. The conductive connectors 120 may be physically and electrically connected to the topmost layer of the fine conductive pattern FP distributed on the top surface 110t of the fine redistribution structure 110. It should be noted that the structure shown in FIG. 2 is merely exemplary. In other embodiments, the topmost layer of the fine conductive pattern FP may be partially covered by the fine dielectric layer FD, and the openings of the fine dielectric layer FD expose at least a portion of the fine conductive pattern FP, in such configuration, the conductive connectors 120 are formed inside the openings of the fine dielectric layer FD to be connected to the topmost layer of the fine conductive pattern FP.

For example, each conductive connector 120 includes a bump portion 122 physically connected to the fine conductive pattern FP, and a cap portion 124 formed on the bump portion 122. The bump portion 122 and the cap portion 124 may be made of different materials and may be formed by different processes. For example, the bump portions 122 are formed by plating copper pillars or other suitable metallic bumps made of gold, nickel, aluminium, tin, metal alloy, etc. The cap portions 124 may be solder caps formed by printing, dispensing, etc. In other embodiments, the cap portions 124 are omitted, and the conductive connectors 120 are metal bumps without solder materials formed thereon. The height of each conductive connector 120 may range from about 20 µm to about 200 µm. In some embodiments, at least the fine redistribution structure 110 and the conductive connectors 120 are collectively viewed as the first portion 100 of a circuit carrier.

Referring to FIG. 3, the first portion 100 may further include a surface finishing layer 130. For example, the fine redistribution structure 110 and the conductive connectors 120 are transferred to a second temporary carrier 60. For example, the structure shown in FIG. 2 is flipped upside down to be placed over the second temporary carrier 60. The second temporary carrier 60 may be provided with a second release layer 61 to enhance the releasibility in a subsequent process. The materials of the second temporary carrier 60 and the second release layer 61 may be similar to those of the first temporary carrier 50 and the first release layer 51. In some embodiments, the second release layer 61 is thick enough to at least bury the conductive connectors 120 therein. The conductive connectors 120 may be or may not be in direct contact with the second temporary carrier 60. For example, the second release layer 61 is spatially apart the conductive connectors 120 from the second temporary carrier 60.

The first temporary carrier 50 may be removed after or before the conductive connectors 120 are inserted into the second release layer 61. For example, the first temporary carrier 50 may be removed from the bottom surface 110b of the fine redistribution structure 110 by applying external energy between the bottom surface 110b and the first temporary carrier 50 to peel off the first release layer 51. Other suitable processes may be used to remove the first temporary carrier 50. A cleaning process is optionally performed on the bottom surface 110b of the fine redistribution structure 110 to remove the residue of the first release layer 51. In some embodiments, after the bottom surface 110b of the fine redistribution structure 110 is exposed, a surface finishing process is performed on the bottommost layer of the fine conductive pattern FP distributed on the bottom surface 110b of the fine redistribution structure 110 to form the surface finishing layer 130 thereon for protection and/or solderability. For example, the surface finishing layer 130 may be a nickel-gold plated layer or other suitable conductive layer(s).

Referring to FIG. 4, the fine redistribution structure 110 and the surface finishing layer 130 formed thereon are adhered to a third temporary carrier 70 through a third release layer 71 for carrying the structure shown in FIG. 4. The third temporary carrier 70 and the third release layer 71 may be similar to the first temporary carrier 50 and the first release layer 51, respectively. In some embodiments, after forming the surface finishing layer 130 and attaching to the third temporary carrier 70, the second temporary carrier 60 may be removed from the fine redistribution structure 110 and the conductive connectors 120 by, for example, applying external energy to peel off the second release layer 61, etching, grinding, mechanical peeling, or other suitable processes to remove the second temporary carrier 60 and the second release layer 61. A cleaning process is optionally performed at least on the conductive connectors 120 to remove the residue of the second release layer 61. In other embodiments in which the surface finishing layer 130 is omitted, the processes described in FIG. 3 and FIG. 4 may be skipped.

Referring to FIG. 5, the first portion 100 is disposed on the second portion 200. The structure including the first portion 100 and the second portion 200 bonded to each other may be collectively viewed as the circuit carrier 10. For example, the second portion 200 includes a top redistribution structure 210, a core layer 220, a plurality of through core vias 230, and a bottom redistribution structure 240. The conductive connectors 120 of the first portion 100 are disposed on the top redistribution structure 210 of the second portion 200. The top redistribution structure 210 and the bottom redistribution structure 240 are disposed on two opposite sides of the core layer 220, and the through core vias 230 passing through the core layer 220 may provide a vertical conductive path between the top redistribution structure 210 and the bottom redistribution structure 240.

The core layer 220 is a polymer layer or made of any suitable dielectric material. The core layer 220 may be thicker than the insulating layer 300. In some embodiments, the core layer 220 is the thickest layer among the fine redistribution structure 110, the insulating layer 300, the top redistribution structure 210, and the bottom redistribution structure 240. The through core vias 230 laterally encapsulated by the core layer 220 may be made of conductive material(s) such as copper, gold, nickel, aluminium, tin, metal alloy, combination of these, etc. The dimension (e.g., height, width, length, diameter, etc.) of each of the through core vias 230 may be greater than the dimension of each of the conductive connectors 120. The pitch of two adjacent through core vias 230 is greater than the pitch of two adjacent conductive connectors 120.

The top redistribution structure 210 and the bottom redistribution structure 240 may be referred to as build-up structures including dielectric layer and conductive layers. For example, top dielectric layers 212 of the top redistribution structure 210 and bottom dielectric layers 242 of the bottom redistribution structure 240 are formed by laminating dielectric material over a formed conductive layer or the core layer 220, and top conductive layers 214 of the top redistribution structure 210 and bottom conductive layers 244 of the bottom redistribution structure 240 are respectively formed on the top dielectric layers 212 and the bottom dielectric layers 242. The dielectric layers (e.g., 212, 242) in the build-up structure insulates the conductive layer (e.g., 214, 244), from conductive traces underneath the dielectric layer (e.g., 212, 242).

Figure 6:
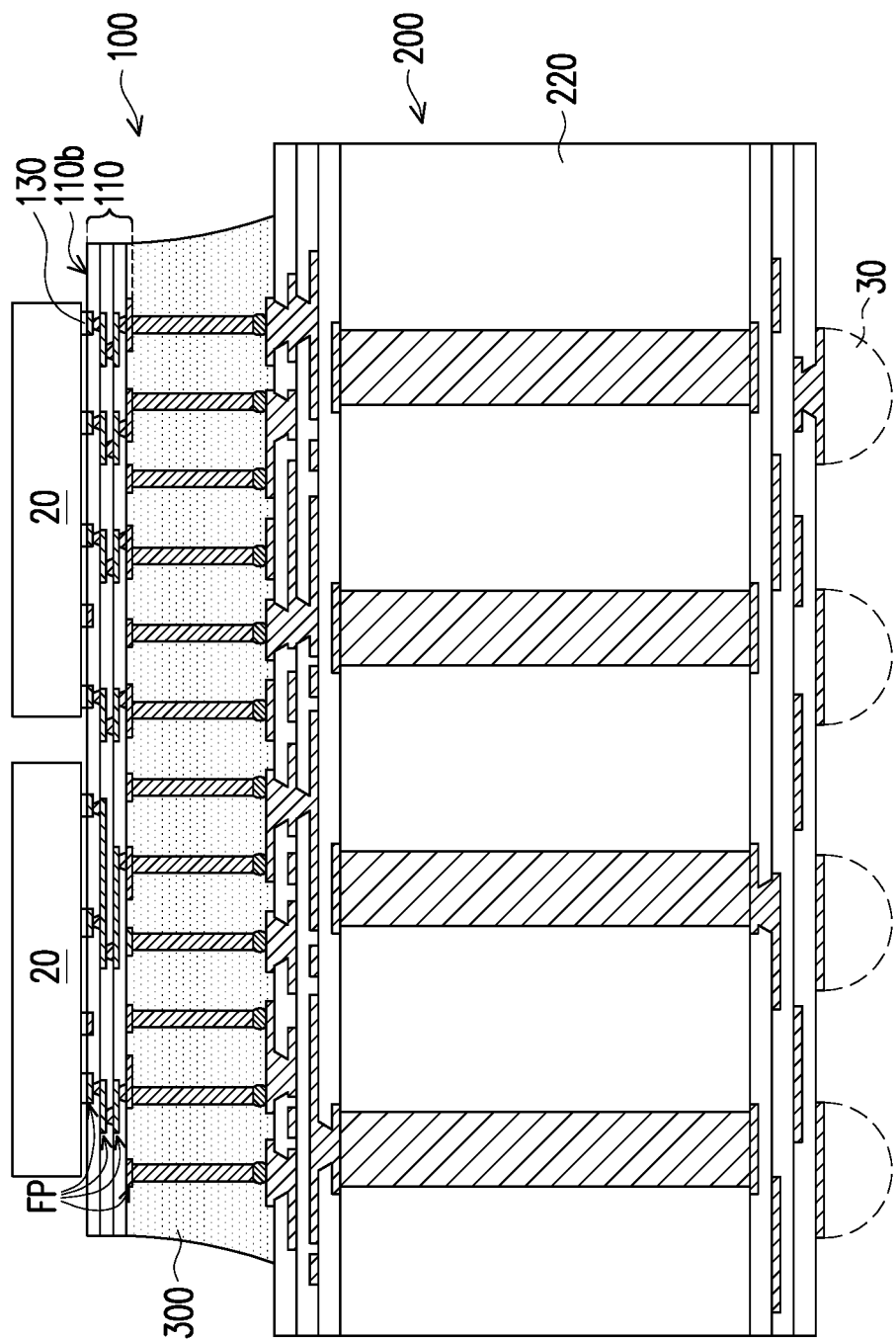

The conductive elements (e.g., conductive patterns, conductive vias, conductive lines, or conductive pads) of the top conductive layers 214 and the bottom conductive layers 244 are coarser than the conductive elements (e.g., fine conductive pattern FP, fine conductive vias FV, conductive lines) of the fine redistribution structure 110. For example, the dimension of each conductive element (e.g., fine conductive via FV and the fine conductive pattern CP including lines and pads) of the fine redistribution structure 110 is finer than that of the corresponding conductive element of the conductive layers (e.g., 214, 244). The thickness of the top dielectric layers 212 of the top redistribution structure 210 or the bottom dielectric layers 242 of the bottom redistribution structure 240 may be thicker than the fine dielectric layer FD of the fine redistribution structure 110. In some embodiments, for a given area (e.g., an area where the conductive connectors 120 are disposed on and/or an area where external terminals shown in FIG. 6 are disposed on), the contact density of the top redistribution structure 210 is denser than the contact density of the bottom redistribution structure 240. Alternatively, the bottom redistribution structure 240 is omitted.

In some embodiments, a soldering process and/or reflowing process may be performed between the conductive connectors 120 of the first portion 100 and the top redistribution structure 210 of the second portion 200. For example, the bump portions 122 of the conductive connectors 120 are bonded to the topmost layer of top conductive layers 214 through the cap portions 124 which are reflowed for enhancement of the adhesion between the first portion 100 and the second portion 200. In some embodiments, after disposing the first portion 100 on the second portion 200, an insulating layer 300 is formed between a gap of the fine redistribution structure 110 and the top redistribution structure 210 to at least laterally cover the conductive connectors 120 to enhance the reliability of attachment. In some embodiments, the insulating layer 300 is made of underfill material including an epoxy, an acrylic resin, or other suitable insulating material.

For example, a sufficient amount of underfill material is injected or dispensed on the top redistribution structure 210 and may also be filled in the gap (not illustrated) between the fine redistribution structure 110 and the top redistribution structure 210. The underfill material may be in a semi-fluid state when dispensing or injecting. The forming process of the insulating layer 300 may rely on, for example, capillary pressure of the underfill material to flow between the fine redistribution structure 110 and the top redistribution structure 210. Next, a curing process is optionally performed on the underfill material to form the insulating layer 300. In some embodiments, the excess amount of the underfill material may climb up to cover a portion of the fine redistribution structure 110.

In a cross section view, the profile or the sidewall of the insulating layer 300 are not vertical due to surface tension. The interior angle between the profile of the insulating layer 300 and the top redistribution structure 210 may be less than the interior angle between the sidewalls of the conductive connectors 120 and the top redistribution structure 210. Alternatively, the interior angle between the profile of the insulating layer 300 and the top redistribution structure 210 may be substantially equal to the interior angle between the sidewalls of the conductive connectors 120 and the top redistribution structure 210. The insulating layer 300 may perform multiple functions including environmentally sealing the conductive connectors 120, providing additional mechanical support between the first portion 100 and the second portion 200, and distributing stress among the conductive connectors 120.

Subsequently, the third temporary carrier 70 is removed from the surface finishing layer 130 and the fine redistribution structure 110 by, for example, applying external energy to peel off the third release layer 71 or using other suitable processes to remove the third temporary carrier 70. A cleaning process is optionally performed on the surface finishing layer 130 to remove the residue of the third release layer 71.

Referring to FIG. 6, after de-bonding the third temporary carrier 70 to expose the surface finishing layer 130, at least one semiconductor chip 20 is disposed on the first portion 100 of the circuit carrier 10. In some embodiments, multiple semiconductor chips 20, which perform the same or different functions, are disposed over the bottom surface 110b of the fine redistribution structure 110. In such configuration, multiple semiconductor chips 20 may be electrically connected to each other through the fine redistribution structure 110, and may also be electrically connected to external device(s) through the circuit carrier 10. The amount of the semiconductor chips 20 mounted on the circuit carrier 10 construes no limitation in the disclosure. In some embodiments, the circuit carrier 10, especially the core layer 220, provides the mechanical strength to support the semiconductor chip(s) 20 mounted thereon.

The semiconductor chip 20 may be an integrated circuit chip/die singulated from a device wafer. In other embodiments, the semiconductor chip may be or may include a chip package including an integrated circuit chip/die packaged in an insulating encapsulation. The semiconductor chip 20 may be disposed over the bottom surface 110b of the fine redistribution structure 110 through a flip-chip bonding process. The distribution density of chip connectors (not shown) of the semiconductor chips 20 and the distribution density of the fine conductive pattern FP may be substantially matched. For example, the chip connectors of the semiconductor chips 20 face toward the fine redistribution structure 110 and are connected to the fine conductive pattern FP through the surface finishing layer 130. Other bonding methods such as metal-to-metal bonding (e.g., direct copper-to-copper bonding), hybrid bonding, or other suitable electrical coupling techniques may be employed to mount the semiconductor chips 20 on the circuit carrier 10. The semiconductor chips 20 may include active devices and/or passive devices (e.g., transistors, capacitors, inductors, resistors, etc.) formed therein for performing a variety of electrical functions.

A plurality of external terminals 30 is optionally formed on the bottom redistribution structure 240 of the second portion 200 opposite to the core layer 220. The external terminals 30 are illustrated as dashed lines to indicate that the external terminals 30 may exist or may not exist. The external terminals 30 may be electrically coupled to the semiconductor chip 20 through the circuit carrier 10. For example, the external terminals 30 are solder balls, and may be formed using a ball placement process to place on the bond pads of the bottom redistribution structure 240. A soldering process and/or a reflowing process may be performed to enhance the adhesion between the external terminals 30 and the bottom redistribution structure 240. In some embodiments, the structure shown in FIG. 6 is further mounted on such as a system board, a mother board, electrical apparatus, or the like.

Figure 7:
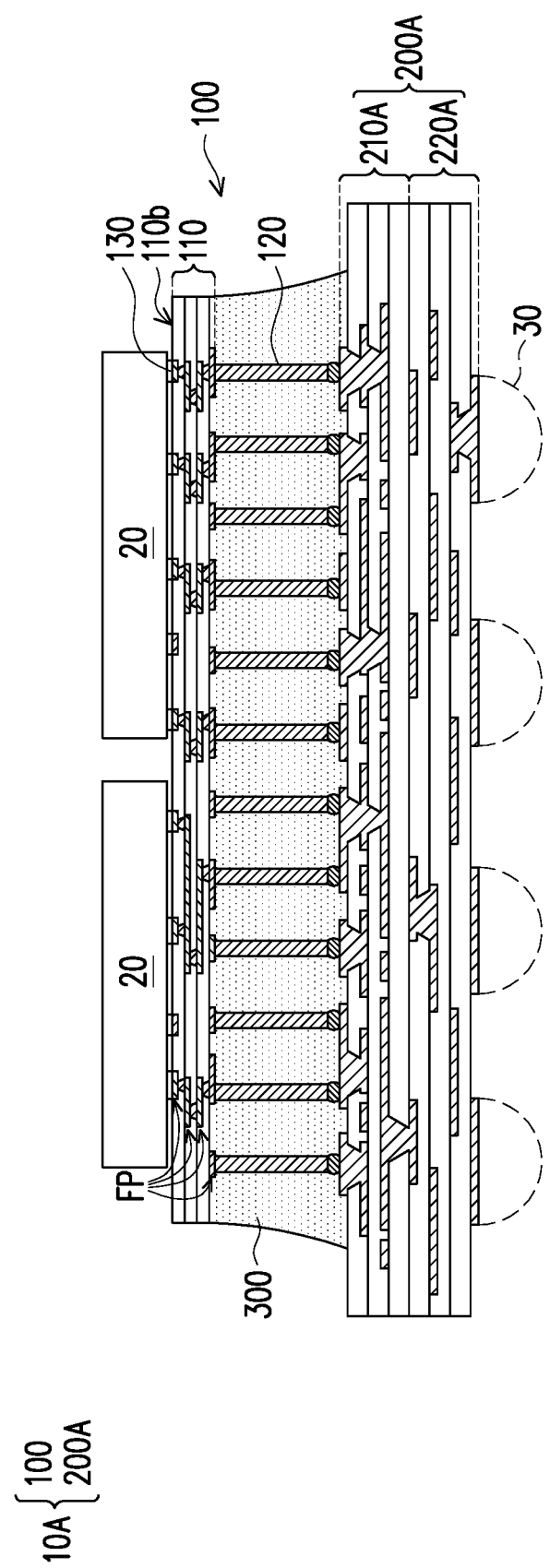
FIG. 7 is a schematic cross-sectional view illustrating a circuit carrier with a chip mounted thereon according to some embodiments of the invention.

FIG. 7 is a schematic cross-sectional view illustrating a circuit carrier with a chip mounted thereon according to some embodiments of the invention. The structure shown in FIG. 7 is similar to the structure shown in FIG. 6, and the difference therebetween lies in the second portion 200A of the circuit carrier 10A. Referring to FIG. 7, the semiconductor chips 20 and the external terminals 30 are optionally disposed at two opposing sides of the circuit carrier 10A. The circuit carrier 10A includes the first portion 100 and the second portion 200A connected to the first portion 100. The second portion 200A includes the top redistribution structure 210A connected to the first portion 100, and the bottom redistribution structure 220A connected to the top redistribution structure 210A and opposite to the first portion 100.

The second portion 200A is free of the core layer and the through core vias. The contact density of the topmost conductive layer of the top redistribution structure 210A connected to the conductive connectors 120 may be denser than the contact density of the bottommost conductive layer of the bottom redistribution structure 220A connected to the external terminals 30, where the external terminals 30 are optionally formed. The dimension of the conductive connectors 120 may be less than the dimension of the external terminals 30. The conductive vias in the top redistribution structure 210A and the conductive vias of the bottom redistribution structure 220A may be tapered in the same direction from the semiconductor chip 20 to the external terminal 30. Alternatively, the conductive vias in the top redistribution structure 210A and the conductive vias of the bottom redistribution structure 220A are tapered in the opposing direction. The tapering direction of conductive vias in the second portion 200A depends on the fabricating method thereof, which is not limited thereto.

Figure 8:
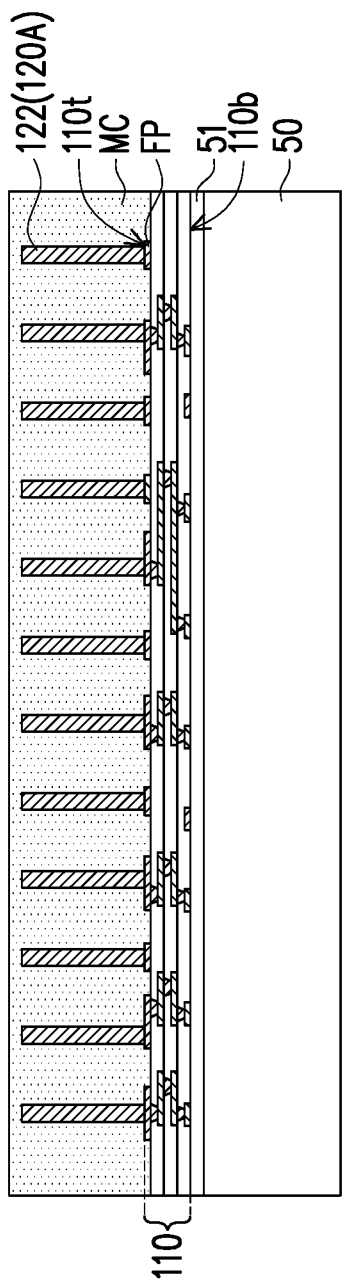
FIG. 8 to FIG. 11 are schematic cross-sectional views illustrating a carrier with a chip mounted thereon according to some embodiments of the invention.

FIG. 8 to FIG. 11 are schematic cross-sectional views illustrating a carrier with a chip mounted thereon according to some embodiments of the invention. Referring to FIG. 8, an insulating material MC is formed on the fine redistribution structure 110 to encapsulate the bump portions 122 of the conductive connectors 120A. For example, the fine redistribution structure 110 is formed over the first temporary carrier 50, and the first release layer 51 is disposed between the first temporary carrier 50 and the bottom surface 110b of the fine redistribution structure 110. The forming process of the fine redistribution structure 110 is similar to that of the fine redistribution structure 110 described in FIG. 1.

After forming the fine redistribution structure 110, the bump portions 122 of the conductive connectors 120A may be formed directly on the topmost level of the fine conductive pattern FP such that the conductive connectors 120A are physically and electrically connected to the fine redistribution structure 110. The material and the forming process of the bump portions 122 are similar to those of the bump portions 122 described in FIG. 2. After forming the bump portions 122, the insulating material MC is formed on the top surface 110t (labelled in FIG. 9) of the fine redistribution structure 110. The insulating material MC may be or may include a molding compound, epoxy resin, or other electrically insulating material formed by a molding process or other suitable process. In some embodiments, the bump portions 122 may be over-molded by the insulating material MC.

Figure 9:
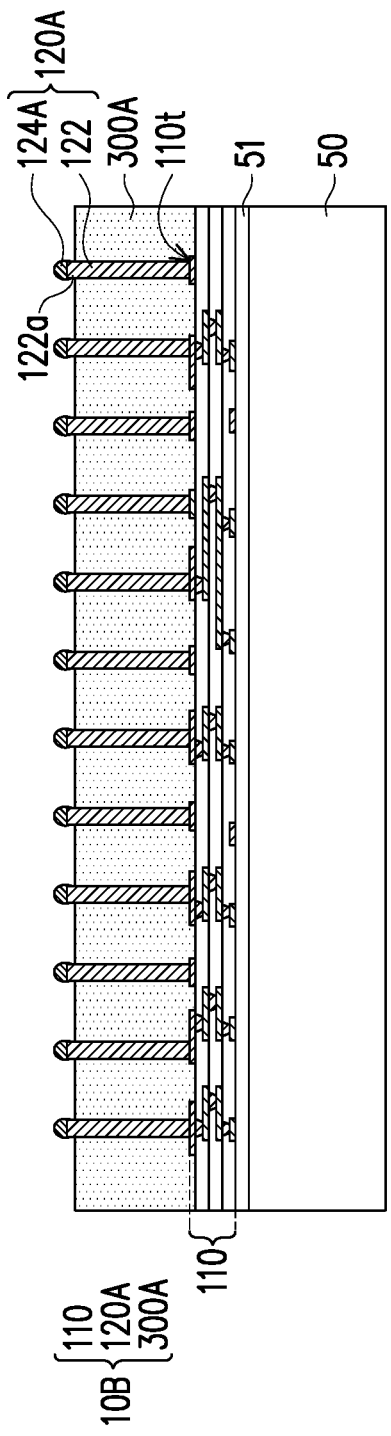

Referring to FIG. 9, in certain embodiments in which the bump portions 122 is fully covered by the insulating material MC, the thickness of the insulating material MC may be thinned to expose at least a portion of each of the bump portions 122. For example, a thinning process (e.g., grinding, chemical mechanical polishing (CMP) process, etching, combination of these, etc.) is performed on the insulating material MC to form an insulating layer 300A. After the thinning process, the thickness of the insulating layer 300A is less than the height of each of the bump portions 122. For example, each of the bump portions 122 has a protruding section 122a exposing by and protruding from the insulating layer 300A. Alternatively, the thickness of the insulating layer 300A is substantially equal to the thickness of the height of the bump portion 122. In other embodiments, the thinning process is omitted, a predetermined amount of the insulating material is formed on the fine redistribution structure 110 to partially cover the bump portions 122 and allow the bump portions 122 to have the protruding sections 122a exposing by the insulating layer 300A.

Subsequently, the cap portions 124A may be formed on the protruding sections 122a of the bump portions 122 by dispensing, printing, or other suitable process. In some embodiments, a sufficient amount of cap material (e.g. solder) is formed so that each of the cap portions 124A of the conductive connectors 120A fully covers one of the protruding sections 122a of the bump portions 122. In other embodiments, each of the cap portions 124A of the conductive connectors 120A is formed on the top surface of one of the protruding sections 122a of the bump portions 122 such that the lateral surfaces of the protruding sections 122a are exposed by the cap portions 124A and the insulating layer 300A. In some embodiments in which the conductive connectors 120A pass through the insulating layer 300A made of molding compound, the conductive connectors 120A are referred to as through molding vias. The height of each conductive connector 120A may range from about 20 µm to about 200 µm. In some embodiments, the fine redistribution structure 110, the conductive connectors 120, and the insulating layer 300A are collectively viewed as the circuit carrier 10B.

Figure 10:
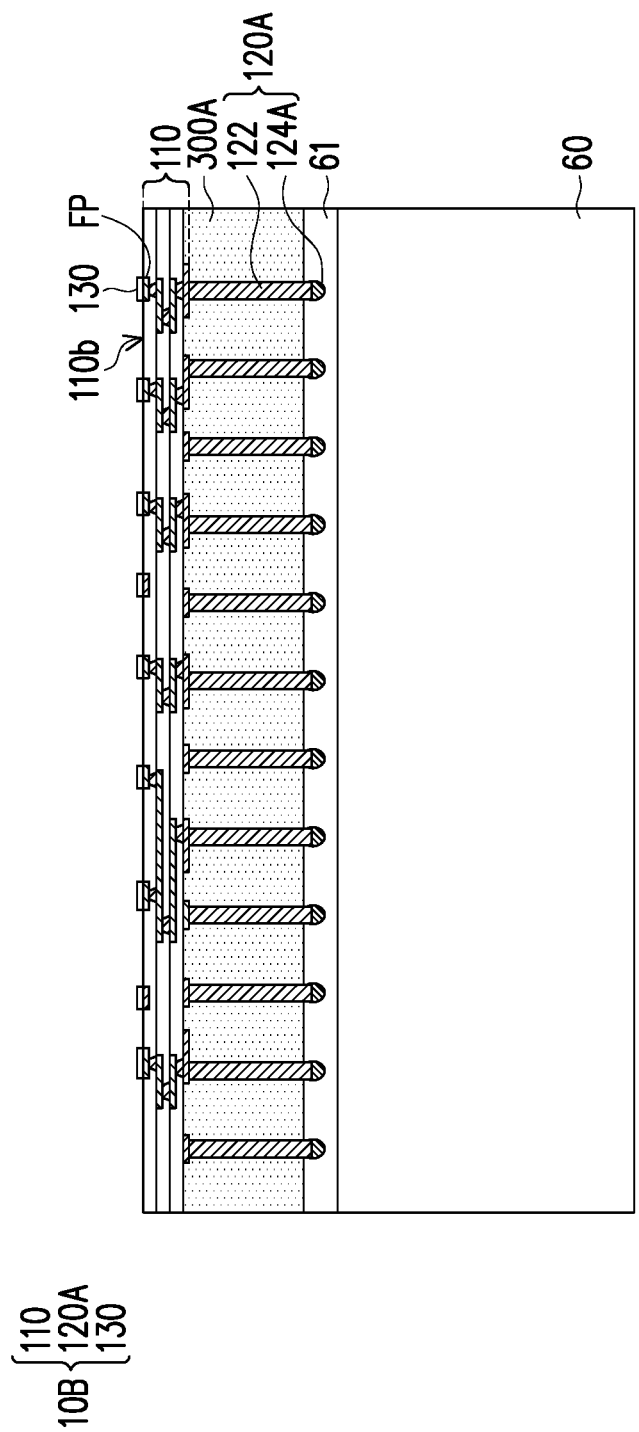

Referring to FIG. 10, the circuit carrier 10B may further include a surface finishing layer 130. The process of forming the surface finishing layer 130 may be similar to the process described in FIG. 3. For example, the fine redistribution structure 110 and the conductive connectors 120A are transferred to the second temporary carrier 60. For example, the structure shown in FIG. 9 is overturned to be placed over the second temporary carrier 60. The second temporary carrier 60 may be provided with the second release layer 61 to enhance the releasibility in a subsequent process. The second release layer 61 may be thick enough to at least embed portions of the conductive connectors 120A exposed by the insulating layer 300A therein. The conductive connectors 120A may be or may not be in direct contact with the second temporary carrier 60. For example, the second release layer 61 is spatially apart the conductive connectors 120A from the second temporary carrier 60.

The first temporary carrier 50 may be removed after or before the conductive connectors 120A are inserted into the second release layer 61. For example, the first temporary carrier 50 may be removed from the bottom surface 110b of the fine redistribution structure 110 by applying external energy between the bottom surface 110b and the first temporary carrier 50 to peel off the first release layer 51 or by using other suitable processes to remove the first temporary carrier 50. A cleaning process is optionally performed on the bottom surface 110b of the fine redistribution structure 110 to remove the residue of the first release layer 51. In some embodiments, after the bottom surface 110b of the fine redistribution structure 110 is exposed, a surface finishing process is performed on the fine conductive pattern FP distributed on bottom surface 110b of the fine redistribution structure 110 to form the surface finishing layer 130 thereon for protection and/or solderability.

Figure 11:
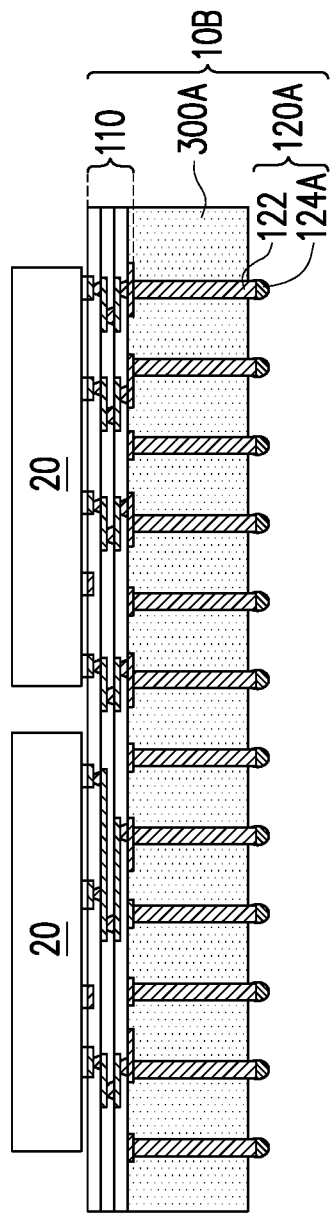

Referring to FIG. 11, in some embodiments, after performing the surface finishing process, at least one semiconductor chip 20 is mounted on the circuit carrier 10B. The disposing process of the semiconductor chip 20 is similar to the process described in FIG. 6. In some embodiments, the second temporary carrier 60 is removed from the circuit carrier 10B before or after mounting the semiconductor chip 20 on the circuit carrier 10B. The removal process of the second temporary carrier 60 and the second release layer 61 may be similar to the process described in FIG. 4. Other applications of the circuit carrier 10B, such as mounting on a packaging substrate, a system board, a mother board, or the like, are possible. The circuit carrier 10B includes the insulating layer 300A which is rigid enough to provide mechanical strength to support the semiconductor chip(s) 20 mounted thereon.

Figure 12:
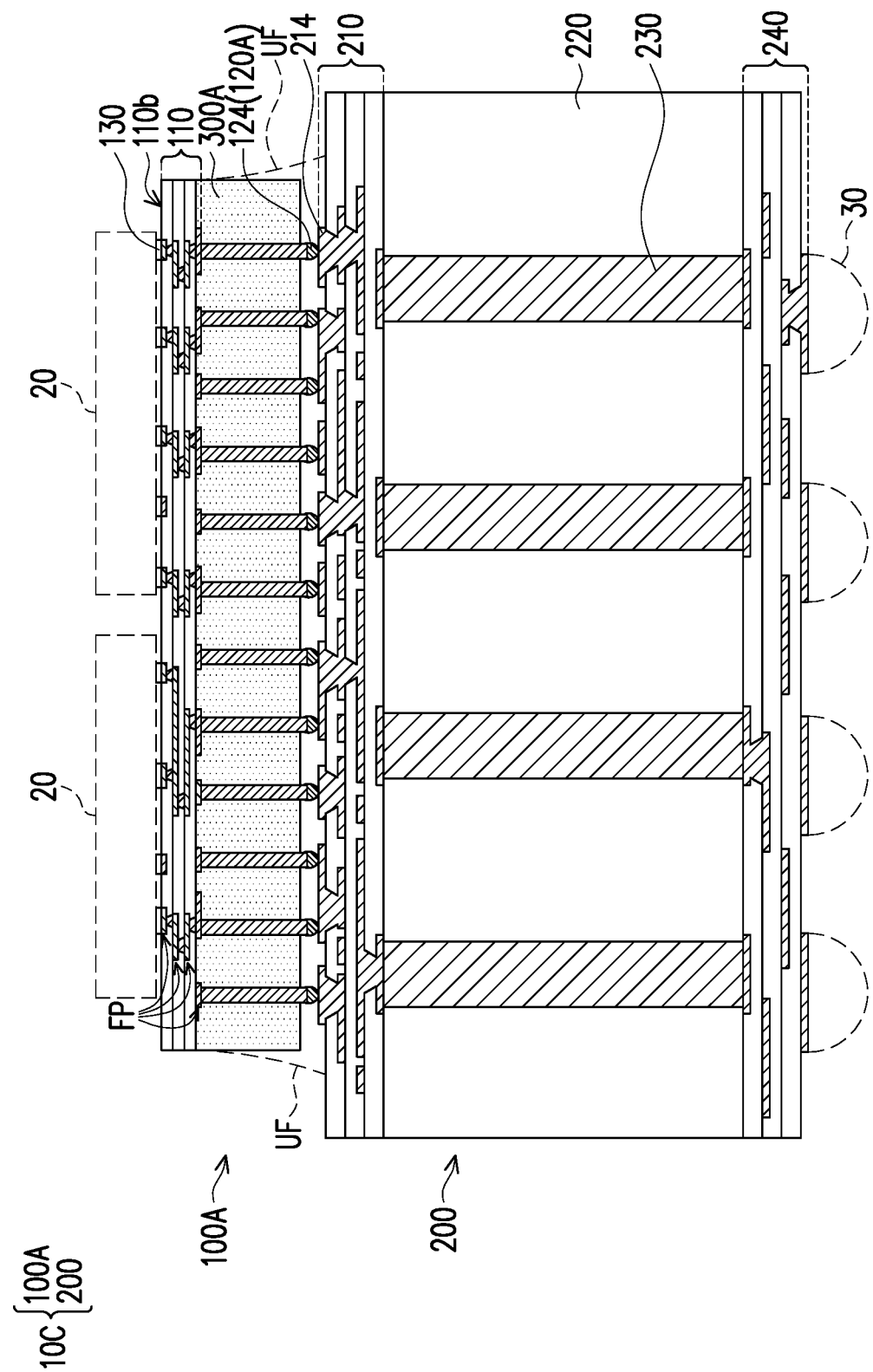
FIG. 12 is a schematic cross-sectional view illustrating a circuit carrier according to some embodiments of the invention.

FIG. 12 is a schematic cross-sectional view illustrating a circuit carrier according to some embodiments of the invention. Referring to FIG. 12, a circuit carrier 10C includes the first portion 100A and the second portion 200. The first portion 100A is the same as the circuit carrier 10B described in FIG. 11 and the second portion 200 is the same as the second portion 200 described in FIG. 6, so the detailed descriptions are not repeated for simplicity and brevity.

The conductive connectors 120A are connected to the top redistribution structure 210, where the cap portions 124A may be directly bonded to the top conductive layers 214 of the top redistribution structure 210. In some embodiments, after bonding the first portion 100A to the second portion 200, an underfill UF is formed on the top redistribution structure 210 and fills the gap between the insulating layer 300A and the top redistribution structure 210 to encapsulate portions of the conductive connectors 120A exposed by the insulating layer 300A. The underfill UF and the insulating layer 300A are made of different materials. Alternatively, the underfill UF is omitted so that the underfill UF is illustrate as dashed lines to indicate it may be or may not be present. The semiconductor chip(s) 20 may be mounted on the fine redistribution structure 110 of the first portion 100A. The external terminals 30 are optionally formed on the bottom redistribution structure 240 of the second portion 200. The electrical signals of the semiconductor chips 20 mounted on the first portion 100A may be transmitted to external devices (not shown) through the circuit carrier 10C and the external terminals 30.

Figure 13:
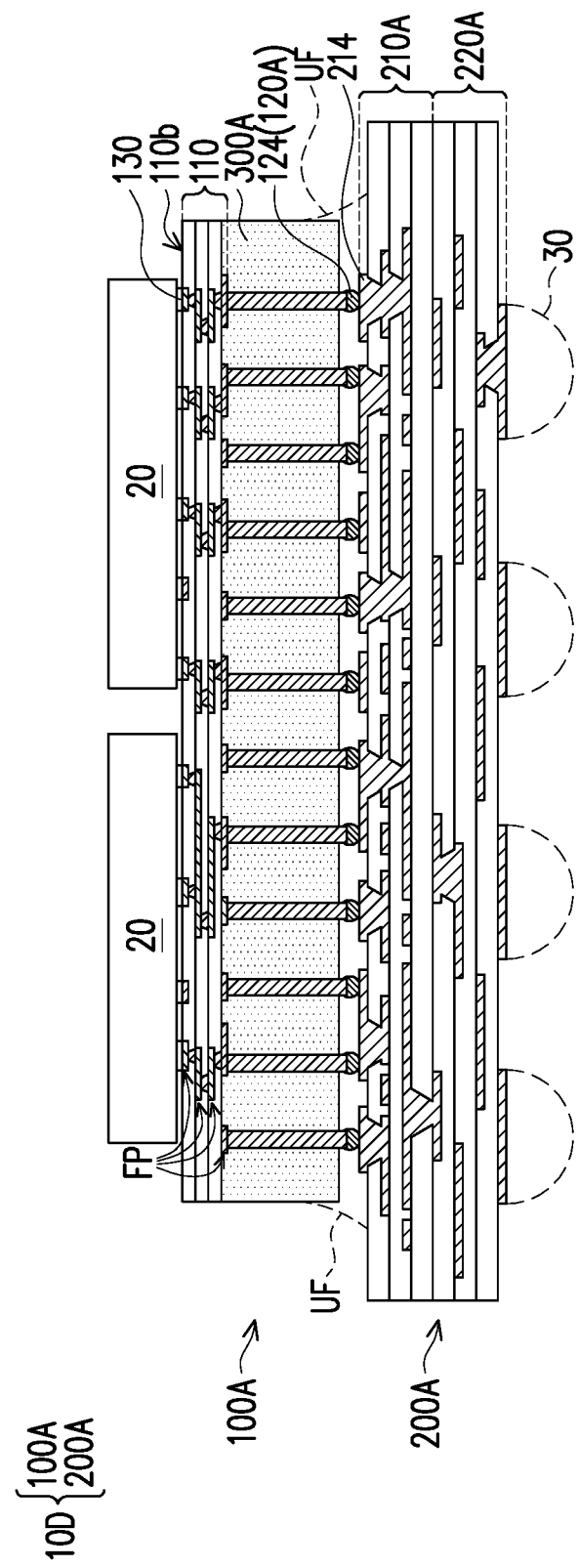
FIG. 13 is a schematic cross-sectional view illustrating a circuit carrier with a chip mounted thereon according to some embodiments of the invention.

FIG. 13 is a schematic cross-sectional view illustrating a circuit carrier with a chip mounted thereon according to some embodiments of the invention. The structure shown in FIG. 13 is similar to the structure shown in FIG. 7. The difference therebetween includes the first portion 100A of the circuit carrier 10D. Referring to FIG. 13, the circuit carrier 10D includes the first portion 100A and the second portion 200A connected to the first portion 100A. The forming process of the first portion 100A is similar to that of the circuit carrier 10B described in FIG. 8 to FIG. 10. The second portion 200A including the top redistribution structure 210A and the bottom redistribution structure 220A in the present embodiment is similar to the second portion 200A described in FIG. 7, so the detailed descriptions are not repeated for simplicity and brevity.

The conductive connectors 120A of the first portion 100A are connected to the top redistribution structure 210A of the second portion 200A, where the cap portions 124A may be directly bonded to the top redistribution structure 210A. After bonding the first portion 100A to the second portion 200A, an underfill UF is optionally formed on the top redistribution structure 210A and fills the gap between the insulating layer 300A and the top redistribution structure 210A to encapsulate portions of the conductive connectors 120A exposed by the insulating layer 300A. The semiconductor chip(s) 20 may be mounted on the fine redistribution structure 110 of the first portion 100A. The external terminals 30 are optionally formed on the bottom redistribution structure 220A of the second portion 200A. The electrical signals of the semiconductor chips 20 mounted on the first portion 100A may be transmitted to external devices (not shown) through the circuit carrier 10D and the external terminals 30.

Figure 14:
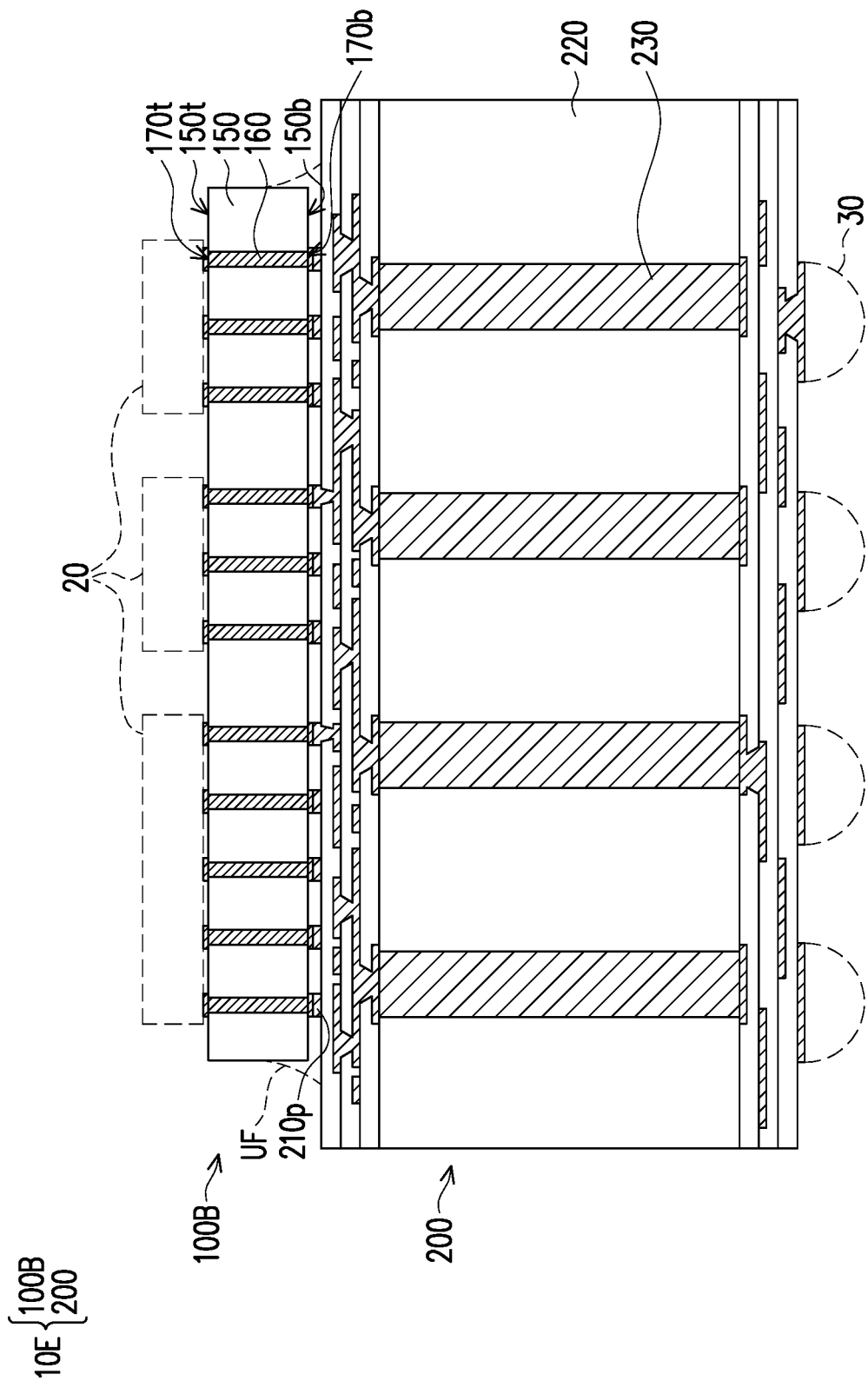
FIG. 14 and FIG. 15 are schematic cross-sectional views illustrating different types of circuit carrier according to some embodiments of the invention.
Figure 15:
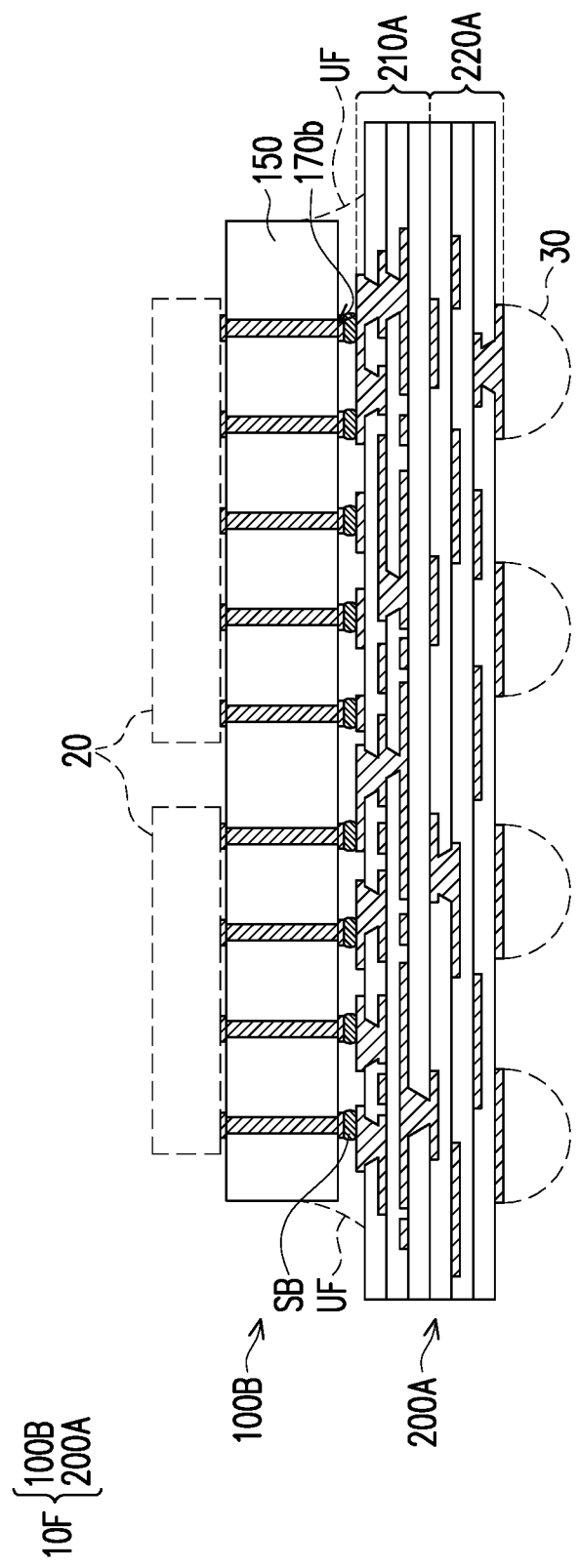

FIG. 14 and FIG. 15 are schematic cross-sectional views illustrating different types of circuit carrier according to some embodiments of the invention. Referring to FIG. 14, a circuit carrier 10E includes the first portion 100B and the second portion 200 connected to the first portion 100B. The first portion 100B includes a substrate 150 having a top surface 150t and a bottom surface 150b opposite to each other, a plurality of through substrate vias 160 passing through the substrate 150, a plurality of top pads 170t disposed on the top surface 150t and connected to the through substrate vias 160, and a plurality of bottom pads 170b disposed on the bottom surface 150b of the substrate 150 and connected to the through substrate vias 160.

For example, the substrate 150 of the first portion 100B and the core layer 220 of the second portion 200 are made of different materials. The substrate 150 may be made of silicon, and the through substrate vias 160 may be referred to as through silicon vias (TSVs). The through substrate vias 160 are finer than the through core vias 230 of the second portion 200, and the pitch of two adjacent through substrate vias 160 is less than the pitch of two adjacent through core vias 230. The first portion 100B may be free of redistribution layer (RDL). For example, no routing trace is formed on the substrate 150 to reroute or expand the signal-transmitting pathway.

The semiconductor chips 20 may be disposed on the top pads 170t of the first portion 100B, and the second portion 200 may be disposed on the bottom pads 170b of the first portion 100B. In some embodiments, the interface between at least one semiconductor chip 20 and the top pads 170t of the first portion 100B is free of solder materials. The semiconductor chip 20 and the first portion 100B may be bonded without disposing solder balls therebetween. For example, the semiconductor chip 20 and the top pads 170t of the first portion 100B are bonded by using direct metal-to-metal bonding or other suitable techniques. The first portion 100B may provide vertical connection between the semiconductor chips 20 and the second portion 200. In some embodiments, the first portion 100B is referred to as an interposer.

In some embodiments, the bottom pads 170b of the first portion 100B are directly bonded to the bonding pads 210p of the top redistribution structure 210 of the second portion 200. The interface between the bottom pad 170b and the corresponding bonding pad 210p may be free of solder material. For example, a direct metal-to-metal bonding or the like may be used to bond the first portion 100B to the second portion 200. In some embodiments, after the first portion 100B and the second portion 200 are bonded, the underfill UF is optionally formed between the first portion 100B and the second portion 200 to enhance the reliability of the circuit carrier 10E. The external terminals 30 are optionally disposed on the second portion 200 opposite to the first portion 100B for transmitting the electrical signal to or from the semiconductor chips 20.

Referring to FIG. 15, the semiconductor chips 20 are mounted on a circuit carrier 10F. The circuit carrier 10F includes the first portion 100B and the second portion 200A connected to the first portion 100B. The first portion 100B in the present embodiment may be similar to the first portion 100B described in FIG. 14, and the second portion 200A in the present embodiment may be similar to the second portion 200A described in FIG. 7. In some embodiments, a plurality of solder balls SB is disposed between the first portion 100B and the second portion 200A.

The solder balls SB may be formed by a reflow process applied to solder material deposited on the bottom pads 170b of the first portion 100B. The solder balls SB are then soldered to the topmost one of the conductive layers of the top redistribution structure 210A. In some embodiments, after bonding the first portion 100B to the second portion 200A through the solder balls SB, the underfill UF is optionally formed between the first portion 100B and the second portion 200A to at least laterally cover the solder balls SB for protection. In some embodiments, the external terminals 30 formed on the bottom redistribution structure 220A are made of the same material as the solder balls SB. The sizes of the external terminals 30 are larger than the sizes of the solder balls SB disposed between the first portion 100B and the second portion 200A.

Based on the above, the first portion of the circuit carrier for semiconductor chips mounted thereon includes the conductive connectors, and the underfill layer or the insulating layer laterally covering the conductive connectors for protection. In such configuration, the conventional silicon substrate is omitted, thereby reducing the manufacturing cost and keeping the manufacturing process simple. The second portion of the circuit carrier connected to the first portion may include the core layer and the through core vias passing through the core layer. In other embodiments, the core layer and the through core vias are omitted, thereby reducing the overall thickness and keeping the conductivity path short. The first portion and the second portion may be bonded to each other without disposed solder balls therebetween while keeping the reliability of the circuit carrier.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A carrier for a semiconductor chip mounting thereon, comprising:
   a fine redistribution structure having a first surface and a second surface opposite to each other, wherein the semiconductor chip is mounted on the first surface of the fine redistribution structure;
   a plurality of conductive connectors disposed on the second surface of the fine redistribution structure and electrically coupled to the semiconductor chip through the fine redistribution structure, wherein each of the conductive connectors comprises a bump and a solder cap physically connected to the bump, and the bump is directly connected to the fine redistribution structure;
   a top redistribution structure, directly connected to the solder cap of the conductive connectors;
   an insulating layer disposed on the second surface of the fine redistribution structure to laterally cover the entire conductive connectors; and
   a surface finishing layer disposed on the fine redistribution structure opposite to the conductive connectors, wherein the semiconductor chip is electrically connected the fine redistribution structure through the surface finishing layer.

2. The carrier according to claim 1, wherein the insulating layer is made of an underfill material or a molding compound.

3. The carrier according to claim 1, further comprising:
   a bottom redistribution structure connected to the top redistribution structure and disposed opposite to the conductive connectors, wherein conductive elements of the top redistribution structure and the bottom redistribution structure are coarser than conductive elements of the fine redistribution structure, and a contact density of the top redistribution structure is denser than a contact density of the bottom redistribution structure.

4. The carrier according to claim 1, further comprising:
   a core layer having a top surface and a bottom surface opposing to each other, wherein the top redistribution structure is disposed on the top surface and the bottom redistribution structure is disposed on the bottom surface; and a plurality of through core vias passing through the core layer and electrically connected to the top redistribution structure and the bottom redistribution structure.

5. The carrier according to claim 4, wherein a dimension of each of the conductive connectors is less than a dimension of each of the through core vias.

6. The carrier according to claim 3, wherein the insulating layer partially covers the conductive connectors, and each of the conductive connectors has a section protruding from the insulating layer and connected to the top redistribution structure.

7. The carrier according to claim 1, wherein a height of one of the conductive connectors ranges from 20 μm to 200 μm.

\* \* \* \* \*